(12) United States Patent
Hu

(10) Patent No.: US 7,368,796 B2
(45) Date of Patent: May 6, 2008

(54) METAL GATE ENGINEERING FOR SURFACE P-CHANNEL DEVICES

(75) Inventor: Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 11/371,657

(22) Filed: Mar. 8, 2006

(65) Prior Publication Data

US 2006/0163663 A1 Jul. 27, 2006

Related U.S. Application Data

(60) Division of application No. 11/012,049, filed on Dec. 14, 2004, now Pat. No. 7,064,390, which is a continuation of application No. 10/659,728, filed on Sep. 10, 2003, now Pat. No. 6,831,343, which is a division of application No. 09/887,449, filed on Jun. 22, 2001, now Pat. No. 6,645,798.

(51) Int. Cl.
*H01L 31/00* (2006.01)
(52) U.S. Cl. .............. 257/454; 257/288; 257/350; 257/E21.006; 257/E21.632; 257/E21.637; 257/E29.161
(58) Field of Classification Search ........... 257/454, 257/455, 456, 350, 351, 331, 510, 288, 649, 257/914
See application file for complete search history.

(56) References Cited

U.S. PATENT DOCUMENTS

| 5,576,244 | A | | 11/1996 | Hayashi et al. |
|---|---|---|---|---|
| 5,753,557 | A | | 5/1998 | Tseng |
| 5,854,115 | A | * | 12/1998 | Gardner et al. ............ 438/305 |
| 5,960,319 | A | | 9/1999 | Iwata et al. |
| 6,013,546 | A | | 1/2000 | Gardner et al. |
| 6,645,798 | B2 | * | 11/2003 | Hu ............................ 438/197 |
| 6,831,343 | B2 | * | 12/2004 | Hu ............................ 257/454 |
| 7,064,390 | B2 | * | 6/2006 | Hu ............................ 257/350 |

OTHER PUBLICATIONS

Wolf PH.D., Stanley, "Silicon Processing for the VLSI Era", vol. 2, Process Integration; Lattice Press (1990), ISBN 0-961672-4-5, pp. 301-304.

* cited by examiner

*Primary Examiner*—David Nhu
(74) *Attorney, Agent, or Firm*—Knobbe, Martens, Olson & Bear LLP

(57) ABSTRACT

A semiconductor device, such as a CMOS device, having gates with a high work function in PMOS regions and low work functions in NMOS regions and a method of producing the same. Using nitrogen implantation or plasma annealing, a low work function W (or $CoSi_x$)/$TaSi_xN_y$/GOx/Si gate stack is formed in the NMOS regions while a high work function W (or $CoSi_x$)/$Ta_5Si_3$/GOx/Si gate stack is formed in the PMOS regions. The improved process also eliminates the need for a nitrided GOx which is known to degrade $g_m$ (transconductance) performance. The materials of the semiconductor devices exhibit improved adhesion characteristics to adjacent materials and low internal stress.

21 Claims, 2 Drawing Sheets

METAL GATE ENGINEERING FOR SURFACE P-CHANNEL DEVICES

RELATED APPLICATIONS

This application is a divisional of U.S. application Ser. No. 11/012,049, filed Dec. 14, 2004 now U.S. Pat. No. 7,064,390 which is a continuation of the U.S. divisional application Ser. No. 10/659,728 filed Sep. 10, 2003 and issued Dec. 14, 2004 as U.S. Pat. No. 6,831,343, which is a divisional application of U.S. application Ser. No. 09/887,449 filed Jun. 22, 2001 and issued Nov. 11, 2003 as U.S. Pat. No. 6,645,798, each of which are incorporated herein in their entirety by reference.

BACKGROUND OF THE INVENTION

1. Field of the Invention

The present invention relates to the field of semiconductor devices, and in particular, to a method of metal gate work function engineering for surface p-channel devices that eliminates the need for nitrided gate oxides.

2. Description of the Related Art

As is known in the art, MOSFET devices, such as CMOS, have a source and drain region separated by a gate region, all typically formed on a surface of a semiconductive, silicon substrate. Individual devices are typically isolated from each other with isolation structures. Overlying the gate region is a gate stack.

The gate stack enables an overlying conductor to apply a biasing voltage through the gate stack to selectively create and disable a conductive channel between the source and drain regions. Gate stacks typically are multi-layered structures designed to electrically isolate the conductor from the substrate such that minimal current flows through the gate terminal. A dielectric layer, such as silicon oxide, is typically placed above the semiconductor substrate. Then, an interconnecting conductive layer is placed above the dielectric for contact to the conductive layer. The interconnecting conductive layer provides a low resistance, preferably ohmic, contact with the conductor. The composition of the interconnecting layer is typically selected to exhibit good adhesion with both the conductive layer and the underlying dielectric layer and to be compatible with other processing steps and materials. The layers are also chosen to mitigate undesired reactions with adjacent layers in subsequent heat steps that take place during the device fabrication and packaging as well as during use.

The amount of biasing voltage required to enable/disable the conductive channel under the gate is referred to as the threshold voltage ($V_t$). An additional design goal for most applications is that the threshold voltages for the NMOS and PMOS devices be complementary. Achieving complementary threshold voltages typically requires that the work function of the gate stack overlying NMOS devices be lower than the underlying p-type doped semiconductor and higher than the underlying n-type doped semiconductor in PMOS devices.

Achieving differential work functions in the gate stacks overlying the NMOS and PMOS regions places the respective Fermi levels closer to mid-gap between the gate stack and the underlying doped substrate. The known alternative to forming differential work functions in the gate stacks is to modify the work functions of the underlying channels regions through doping. Effectively doping the channel regions typically requires relative high doping levels which increases the bulk conductivity and leads to higher undesirable leakage currents.

One known prior art method of forming a gate stack, illustrated in FIG. 1 for a CMOS device, consists of layering a refractory metal conductor over an interconnecting refractory metal nitride over a dielectric layer on the surface of a semiconductive, silicon substrate. In this example, the materials are W/TiN$_x$ (x<1)/SiOH/Si or W/WN$_x$ (x<1)/SiOH/Si. The tungsten (W) metal provides low bulk resistivity while tolerating subsequent high temperature processing steps. The SiOH is a nitrided gate oxide. The gate oxide is nitrided to inhibit the adjacent metal rich TiN$_x$ or WN$_x$ from reacting with underlying silicon dioxide without nitride in subsequent heat steps. The heat steps can induce metal atoms to migrate and react with the gate oxide where the metal atoms oxidize thus consuming oxygen atoms from the oxide. This results in the gate oxide SiO$_2$ being transformed into SiO$_x$ (x<2) which is a less effective insulator and can result in dielectric breakdown which would result in device failure. Whereas the nitrided gate oxide resists this oxygen consumption and retains good insulating characteristics.

A drawback, however, is that the nitrided gate oxide, SiOH, layer in the gate stack is known to degrade the transconductance ($g_m$) characteristics of the devices formed with this method. Transconductance is a measure of the small signal amplification of a MOSFET device. Transconductance is the partial differential of drain current with respect to gate voltage and is dependent on the gate capacitance. The transconductance is a measure of the speed of the device and, as is well understood in the art, faster device speed is a desirable feature. The gate stack is preferably formed with as low a junction capacitance as possible in order to increase switching speed. The partially nitrided silicon oxide has a higher dielectric constant that pure silicon dioxide and thus gives an increased capacitance, which correspondingly lowers the device speed.

This prior art process then involves applying photoresist to selectively mask the PMOS regions. Nitrogen is then implanted into the TiN$_x$ or WN$_x$ (x<1) areas of the NMOS regions. The work function of the gate stack over the NMOS regions is reduced with increasing nitrogen content in the titanium or tungsten nitride layers. The TiN$_x$ has a relatively large work function and TiN is near mid-gap. However, this type of metal nitride based metal gate structure has some disadvantages. In particular, the metal rich TiN$_x$ (x<1) can react with an adjacent tetraethylorthosilicate (TEOS) spacer during subsequent TEOS deposition.

In a similar manner to that previously described with respect to the nitrided gate oxide, titanium atoms can react with the SiO$_2$ from the TEOS. This reaction consumes oxygen atoms from the silicon oxide resulting in a silicon rich, nonstoichiometric SiO$_x$ (x<2). The SiO$_x$ is a less effective insulator than the silicon oxide and can result in incomplete isolation between individual devices and circuit failure. For this reason, typically only a Nit spacer can be used as a Nit spacer is resistant to reaction with the titanium.

However, a Nit spacer is undesirable from the perspective of the increased dielectric constant of the Nit compared to the silicon dioxide of the TEOS spacer. The approximately doubled dielectric constant of the Nit spacer results in fringing fields that are approximately twice as intense as the fringing fields around a comparable TEOS spacer under a comparable electric field. The higher fringing fields around Nit spacers can cause dielectric breakdown of the gate oxide particularly near the edges of the gate oxide. As is well understood in the art, breaking down the gate oxide damages the device and typically causes failure of the device. Thus, a TEOS spacer is more robust than a comparable Nit spacer.

A further drawback to the previously mentioned gate materials arises from the internal stress of the materials and their adhesive characteristics. In particular, any deposited material will possess some degree of residual stress. The stress may be either tensile or compressive. Tensile stress is relieved by the material contracting while compressive stress is relieved by the material expanding. If the stress in a deposited layer exceeds its adhesion to adjacent layers, the layer may physically peal off the underlying/overlying surfaces. This would have dramatic negative effects on the reliability of metal lines and other device structures. Large stress may also give rise to void formation during subsequent thermal cycling. The stress provides an impetus for grain boundary diffusion. Suitable materials must possess sufficient adhesion to adjacent layers to inhibit separation due to stress.

The $TiSi_xN_y$ previously described has good adhesion characteristics, however it has a very high stress level ($>15GD/cm^2$). The $WSi_xN_y$ has low stress ($<5GD/cm^2$), however, it suffers from poor adhesive characteristics. As previously mentioned, poor adhesion can also result in a layer becoming dislodged from adjacent layers and resultant device failure.

From the foregoing, it can be appreciated that there is a need for a method of forming a gate stack of materials with good adhesion characteristics and low stress. There is also a need for a method of forming a gate stack with improved transconductance performance and complementary threshold voltage characteristics.

SUMMARY OF THE INVENTION

The aforementioned needs are satisfied by the present invention which, in one aspect, is a semiconductor device comprising a semiconductive substrate, a dielectric layer positioned on the semiconductive substrate, and an interconnecting layer positioned on the dielectric layer wherein the interconnecting layer comprises a metal silicide wherein the metal is matched with the silicide so that the metal is inhibited from reacting with the dielectric layer and also wherein the metal is selected such that selective nitrification of the metal silicide lowers the work function of the metal silicide. In one embodiment, the metal is further selected such that the metal silicide and nitrided metal silicide exhibit improved adhesion to the adjacent layers.

In another aspect, the invention further comprises a conductive layer positioned on the interconnecting layer such that the dielectric layer, the interconnecting layer, and the conductive layer together define a gate stack. In one embodiment, the metal comprises tantalum, the semiconductive substrate comprises silicon, and the dielectric layer comprises silicon dioxide. In other embodiments, the conductive layer comprises tungsten, cobalt silicide, or nickel silicide.

An additional aspect of the invention is a method of selectively setting the work functions of semiconductor materials comprising forming a dielectric layer on a semiconductive substrate, forming an interconnecting layer atop the dielectric layer wherein the interconnecting layer comprises a metal silicide wherein the metal is matched with the silicide in a stable phase such that the metal is inhibited from reacting with the dielectric layer, selectively masking portions of the interconnecting layer, and reacting unmasked regions of the interconnecting layer with nitrogen so as to transform the unmasked regions of the interconnecting layer to reacted metal-silicon nitride such that the masked regions of the interconnecting layer remain unreacted metal silicide wherein the metal is selected such that the metal-silicon nitride has a lower work function than the unreacted metal silicide. In one embodiment, the metal is further selected so that the metal silicide exhibits improved adhesion to adjacent layers.

Another embodiment further comprises forming a conductive layer atop the interconnecting layer wherein the dielectric layer, the reacted and unreacted interconnecting layers, and the conductive layer together define a gate stack of a semiconductor device. In one embodiment of the method, the metal used is tantalum, the semiconductive substrate comprises silicon, and the dielectric layer comprises silicon dioxide. In particular embodiments, the conductive layer comprises tungsten, cobalt silicide, or nickel silicide.

Yet another aspect of the invention is a method of establishing differential work functions in gate stacks overlying complementarily doped regions of semiconductor devices comprising forming a dielectric layer on a semiconductive substrate having complementary regions doped n- and p-type, forming an interconnecting layer atop the dielectric layer wherein the interconnecting layer comprises a metal silicide wherein the metal is matched with the silicide in a stable phase such that the metal is inhibited from reacting with the dielectric layer, selectively masking portions of the interconnecting layer, reacting unmasked regions of the interconnecting layer so as to lower the work function of the unmasked regions such that the masked regions of the interconnecting layer remain unreacted, and selectively removing the masking and portions of the interconnecting layer and the dielectric layer so as to form the gate stacks. In one embodiment, the masking is applied to the n-type regions and reacting comprises nitrification. In certain embodiments, the metal is a middle transition metal and, in one particular embodiment, the metal is tantalum.

The improved gate engineering of the present invention provides selective nitrification of regions of a semiconductor device to selectively modify the work functions of the selected regions to provide complementary work functions in the gate stacks. The metal silicides and metal silicon nitrides of one embodiment of the invention exhibit low reactivity and good adhesion with adjacent materials as well as low internal stress. The improved gate engineering also enables a non-nitrided gate oxide which is unreactive with adjacent layers throughout subsequent heat cycling. The non-nitrided gate oxide also exhibits lower junction capacitance and increased device speed as compared to devices which require a nitrided gate oxide.

These and other objects and advantages of the present invention will become more fully apparent from the following description taken in conjunction with the accompanying drawings.

DETAILED DESCRIPTION OF THE PREFERRED EMBODIMENT

Figure 1:
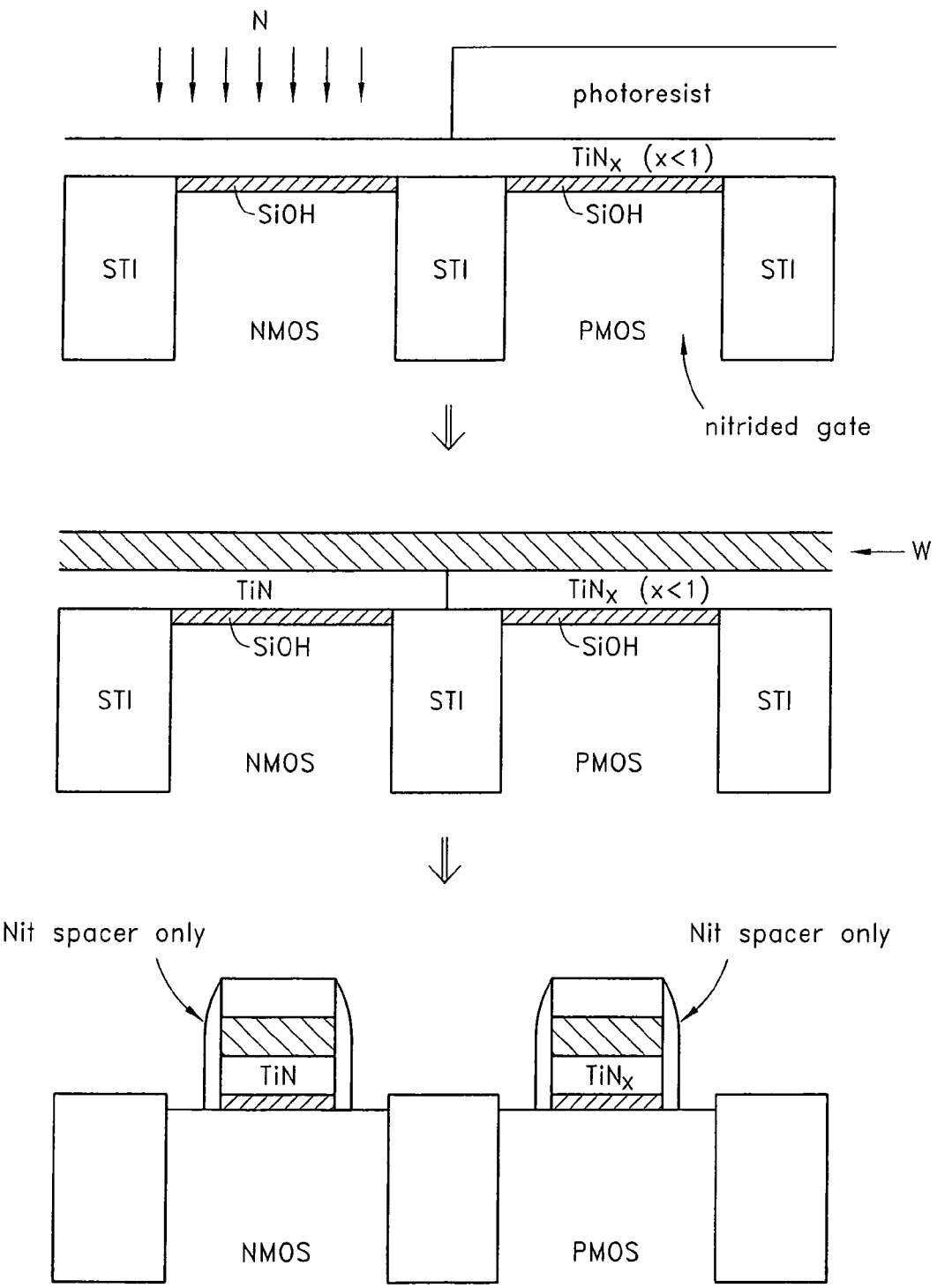
FIG. 1 illustrates a prior art method of forming a gate structure for CMOS devices and FIGS. 2, 3, and 4 illustrate one embodiment of an improved metal gate engineering for surface p-channel devices.
Figure 2:
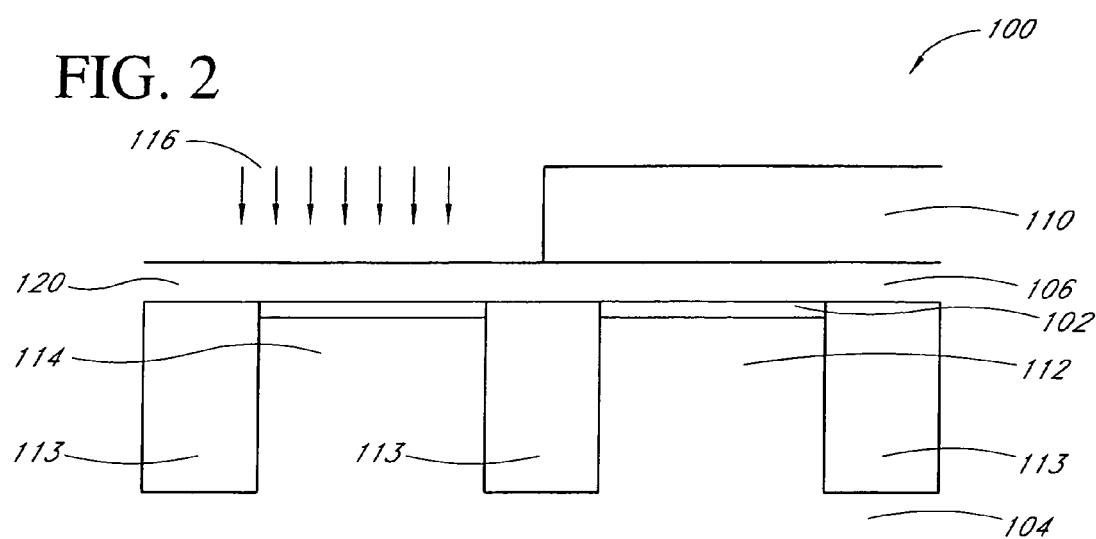

Reference will now be made to the drawings wherein like numerals refer to like parts throughout. FIG. 2 illustrates one embodiment of a preparatory structure for formation of an improved gate engineering 100 of the present invention. A dielectric layer comprising gate oxide (GOx) 102 comprising $SiO_2$ is formed on a semiconductive silicon substrate 104 in a known manner. The silicon substrate 104 also comprises a plurality of isolation structures 113 separating and defining active regions of the substrate 104. In this embodiment, the GOx 102 is approximately 30 Å thick. Then, an interconnecting layer 106 comprising metal silicide is deposited on the gate oxide 102. In one embodiment, the interconnecting layer 106 comprises tantalum silicide $Ta_5Si_3$. In this embodiment, the interconnecting layer 106 is deposited via a known physical vapor deposition (PVD) process and is approximately 300 Å thick. In alternative embodiments, the interconnecting layer 106 comprises tungsten silicide, titanium silicide, cobalt silicide, or nickel silicide.

Then, a photoresist layer 110 is applied over PMOS regions 112 in a known manner so as to selectively mask the PMOS regions 112. The PMOS regions 112 are separated from adjacent active regions, such as other PMOS regions 112 or NMOS regions 114, by the isolation structures 113 which are formed in a known manner. In one embodiment, the unmasked NMOS regions 114 are implanted with nitrogen (N) 116. In this embodiment, the nitrogen implantation 116 comprises an implant of nitrogen of 3E15 at 5 keV. In another embodiment, the nitrogen implantation 116 is done to similar parameters with a plasma anneal in a known manner.

During the nitrogen implantation 116 into the unmasked regions of the interconnecting layer 106, the interconnecting layer 106 is transformed into a nitrided interconnecting layer 120. In one embodiment, the nitrided interconnecting layer 120 comprises tantalum-silicon nitride $TaSi_xN_y$. The nitrided interconnecting layer 120 has a reduced work function compared to the interconnecting layer 106. The interconnecting layer 106 is stable on top of the GOx layer 102 as well as adjacent to a tetraethylorthosilicate (TEOS) spacer 122 to be described in greater detail below in subsequent heat steps. The nitrided interconnecting layer 120 adheres well to the GOx 102 and exhibits low internal stress (~5GD/$cm^2$).

In the alternative embodiments wherein the interconnecting layer 106 comprises tungsten silicide, titanium silicide, cobalt silicide, or nickel silicide, additional heating may be required to form the nitrided interconnecting layer 120. The desired characteristics of the materials for the interconnecting layers 106, 120 include a limited reactivity with and diffusivity into silicon dioxide such as are exhibited by the middle transition metal silicides.

Figure 3:
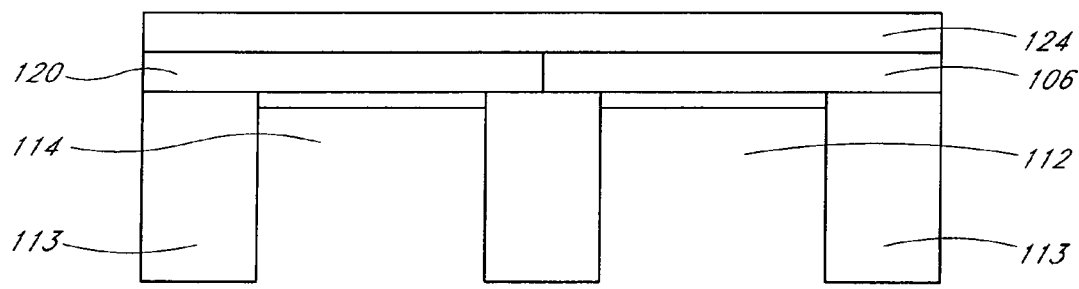

The photoresist 110 is then stripped off as illustrated in FIG. 3. In one embodiment, the stripping is done with APM, a mixture of ammonium hydroxide, hydrogen peroxide, and deionized water in approximately a 5:1:1 ratio. In an alternative embodiment, the stripping is done with Piranha etch in a known manner. APM and Piranha etches are compatible with the interconnecting layer 106 comprising $TaSi_x$ and the nitrided interconnecting layer 120 comprising $TaSi_xN_y$, but not with $TiN_x$. Then a conductive layer 124 comprising a low resistivity material such as tungsten (W), cobalt silicide ($CoSi_2$), or nickel silicide (NiSi) is deposited on top of the interconnecting layers 106, 120. The conductive layer 124 in this embodiment is approximately 500 Å thick and is deposited in a known manner.

Figure 4:
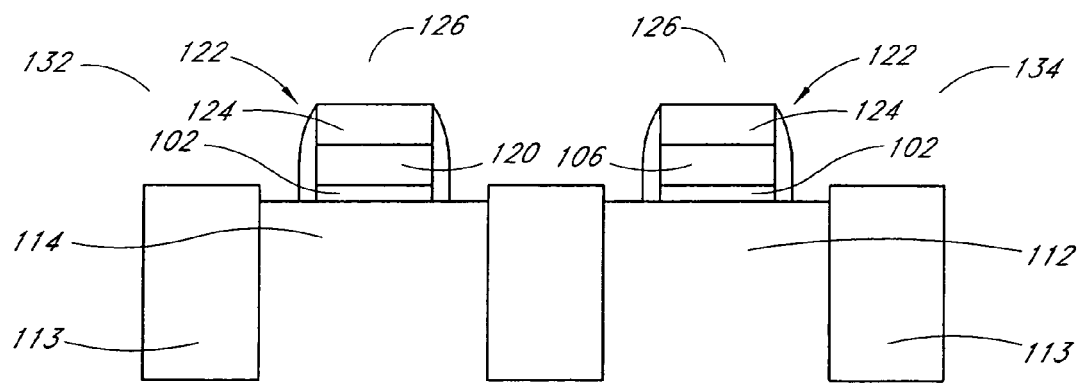

Then, as illustrated in FIG. 4, gate stacks 126 are created by forming a plurality of spacers 122. In one embodiment, the spacers 122 comprise TEOS and in another embodiment comprise silicon nitride. The spacers 122 materially and electrically isolate the conductive structures of the interconnecting layers 106, 120 and the conductive layer 124 from overlying conductive interconnects that are formed in later processing steps. The gate stacks 126 comprise the GOx 102, the interconnecting layers 106, 120, and the conductive layers 124 as contained by the spacers 122.

The use of the interconnecting layer that is formed of a metal silicide inhibits migration of the metal species of the interconnect layer from migrating into the gate oxide. This is generally the result of the metal being matched to the silicide in a stable phase such that the metal is sufficiently bonded to the silicide so as to inhibit migration of the metal species into the gate oxide or into the spacers. As a result, a more efficient gate oxide can be used improving device performance. Moreover, the interconnect layer is also selected such that it can be selectively nitrided to thereby lower the work function. Hence, use of the metal silicide layer permits the use of more efficient gate oxides and spacers and still allows for the selective reduction of work function in CMOS applications.

The gate stacks 126 over the PMOS devices 134 have a desirable higher work function and the gate stacks 126 over the NMOS devices 132 have a desirable lower work function thus resulting in a Fermi level closer to mid-gap between the gate stacks 126 and the underlying PMOS 112 and NMOS 114 regions. The gate stacks 126 also exhibit minimal undesirable reaction with adjacent materials in subsequent processing, low internal stress, and good adhesion to adjacent layers in the PMOS 134 and NMOS 132 devices. Thus, the gate stacks 126 of this embodiment are less likely to physically peal off adjacent layers either during subsequent heat steps or during use of the completed devices employing the improved gate engineering 100.

The gate engineering 100, as herein described, also obviates the need for a nitrided gate oxide and enables the use of GOx 102. The GOx 102 has a lower dielectric constant than a nitrided gate oxide and thus offers improved transconductance (gm) characteristics for the PMOS 134 and NMOS 132 devices employing the improved gate engineering 100 in the manner previously described.

Although the preferred embodiments of the present invention have shown, described and pointed out the fundamental novel features of the invention as applied to those embodiments, it will be understood that various omissions, substitutions and changes in the form of the detail of the device illustrated may be made by those skilled in the art without departing from the spirit of the present invention. Consequently, the scope of the invention should not be limited to the foregoing description but is to be defined by the appended claims.

What is claimed is:

1. Complimentary semiconductor devices comprising:
   a semiconductive substrate;
   complimentary NMOS and PMOS doped regions formed in the semiconductive substrate;
   a dielectric layer comprising silicon oxide positioned on the semiconductive substrate; and
   an interconnecting layer positioned on the dielectric layer so as to define gate stacks over the NMOS and PMOS regions wherein the interconnecting layer comprises a metal silicide wherein a metal of the metal silicide is matched with the metal silicide such that the metal is inhibited from reacting with the dielectric layer and wherein the interconnecting layer adjacent the NMOS doped regions is selectively nitrided such that the interconnecting layer adjacent the NMOS regions comprises nitrided metal silicide such that a work function of the nitrided metal silicide is reduced with respect to the metal silicide adjacent the PMOS regions such that Fermi levels of the gate stacks overlying the NMOS and PMOS regions are more evenly mid-gap.

2. The semiconductor devices of claim 1, wherein the metal is further selected such that the metal silicide and the nitrided metal silicide exhibit improved adhesion to adjacent layers.

3. The semiconductor devices of claim 1, further comprising a conductive layer positioned on the interconnecting layer such that the dielectric layer, the interconnecting layer, and the conductive layer together define a gate stack.

4. The semiconductor devices of claim 3, wherein the conductive layer comprises tungsten.

5. The semiconductor devices of claim 3, wherein the conductive layer comprises cobalt silicide.

6. The semiconductor devices of claim 3, wherein the conductive layer comprises nickel silicide.

7. The semiconductor devices of claim 1, wherein the metal comprises tantalum.

8. The semiconductor devices of claim 1, wherein the semiconductive substrate comprises silicon.

9. A complimentary semiconductor device comprising:
a silicon substrate;
complimentary NMOS and PMOS doped regions formed in the silicon substrate;
a gate dielectric layer comprising silicon oxide positioned on the silicon substrate; and
a metal silicide layer positioned on the dielectric layer so as to define gate stacks adjacent the NMOS and PMOS regions wherein portions of an interconnecting layer adjacent the NMOS doped regions are selectively nitrided such that the interconnecting layer adjacent the NMOS regions has an internal stress less than or equal to approximately 5GD/cm².

10. The complimentary semiconductor device of claim 9, further comprising a conductive layer arranged adjacent the metal silicide layer.

11. The complimentary semiconductor device of claim 10, wherein the conductive layer comprises materials selected such that the conductive layer is matched to the metal silicide in a stable phase so as to inhibit migration of metal species into the gate dielectric layer.

12. The complimentary semiconductor device of claim 10, wherein the metal silicide layer comprises at least one middle transition metal.

13. The complimentary semiconductor device of claim 9, wherein the metal silicide comprises at least one of tantalum silicide, tungsten silicide, titanium silicide, cobalt silicide, and nickel silicide.

14. The complimentary semiconductor device of claim 9, wherein the nitrided metal silicide adjacent the NMOS regions has a reduced work function compared to the metal silicide layer adjacent the PMOS regions.

15. A plurality of semiconductor devices formed on a semiconductive substrate, the plurality of semiconductor devices comprising:
NMOS devices having:
a silicon oxide gate insulating layer; and
a metal silicide interconnecting layer wherein the metal silicide is nitrided and in combination with the silicon oxide layer defines an NMOS gate stack and
PMOS devices having:
a silicon oxide gate insulating layer; and
a metal silicide interconnecting layer that in combination with the silicon oxide layer defines an PMOS gate stack such that a work function of the nitrided metal silicide of the NMOS gate stack is reduced with respect to the metal silicide of the PMOS gate stack such that Fermi levels of the NMOS and the PMOS gate stacks are more evenly mid-gap.

16. The plurality of semiconductor devices of claim 15, further comprising a conductive layer arranged adjacent the nitrided metal silicide and the metal silicide layers.

17. The plurality of semiconductor devices of claim 16, wherein the conductive layer comprises materials selected such that the conductive layer is matched to the metal silicide layers in a stable phase so as to inhibit migration of metal species into the respective silicon oxide gate insulating layers.

18. The plurality of semiconductor devices of claim 16, wherein the metal silicide layers comprises at least one middle transition metal.

19. The plurality of semiconductor devices of claim 15, wherein the metal silicide interconnecting layers comprises at least one of tantalum silicide, tungsten silicide, titanium silicide, cobalt silicide, and nickel silicide.

20. The plurality of semiconductor devices of claim 15, wherein the nitrided metal silicide interconnecting layer of the NMOS devices has a reduced work function compared to the metal silicide interconnecting layer of the PMOS devices.

21. The plurality of semiconductor devices of claim 15, wherein the nitrided metal silicide interconnecting layer of the NMOS devices has an internal stress less than or equal to approximately 5GD/cm².

* * * * *